United States Patent
Pierin et al.

(10) Patent No.: US 6,542,404 B2
(45) Date of Patent: Apr. 1, 2003

(54) SMALL SIZE, LOW CONSUMPTION, MULTILEVEL NONVOLATILE MEMORY

(75) Inventors: Andrea Pierin, Graffignana (IT); Stefano Gregori, Torre d'Isola (IT); Rino Micheloni, Turate (IT); Osama Khouri, Milan (IT); Guido Torelli, Sant'Alessio con Vialone (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/972,726

(22) Filed: Oct. 4, 2001

(65) Prior Publication Data

US 2002/0048187 A1 Apr. 25, 2002

(30) Foreign Application Priority Data

Oct. 6, 2000 (IT) .......................... TO00A0936

(51) Int. Cl.⁷ .............................................. G11C 16/04
(52) U.S. Cl. ............................ 365/185.03; 365/185.18; 365/185.21; 365/207
(58) Field of Search ...................... 365/185.03, 185.18, 365/185.21, 207

(56) References Cited

U.S. PATENT DOCUMENTS 5,995,412 A * 11/1999 Ohta ...................... 365/185.03

OTHER PUBLICATIONS

A. Pierin et al., "High–Speed Low–Power Sense Comparator for Multilevel Flash Memories", Proc. IEEE International Conference on Electronics Circuits and Systems(ICECS), Jourieh(Lebanon), Dec. 2000, pp 759–763.

B. Razavi et al., "Design Techniques for High–Speed, High–Resolution Comparators", Dec. 12, 1992, vol. 27, No. 12, pp. 1916–1926.

* cited by examiner

Primary Examiner—Huan Hoang
(74) Attorney, Agent, or Firm—Lisa K. Jorgenson; Robert Iannucci; Seed IP Law Group PLLC

(57) ABSTRACT

A multilevel nonvolatile memory includes a supply line (28) supplying a supply voltage ($V_{DD}$), a voltage boosting circuit (26) supplying a boosted voltage ($V_p$), higher than the supply voltage ($V_{DD}$), a boosted line (30) connected to the voltage boosting circuit (26) and a reading circuit (25) including at least one comparator (35). The comparator (35) includes a first and a second input (35a, 35b), a first and a second output (45a, 45b), at least one amplification stage (40) connected to the boosted line (30), and a boosted line latch stage (41) connected to the supply line (28).

20 Claims, 4 Drawing Sheets

SMALL SIZE, LOW CONSUMPTION, MULTILEVEL NONVOLATILE MEMORY

BACKGROUND OF THE INVENTION

1. Field of the Invention

The present invention relates to a small size, low consumption, multilevel nonvolatile memory.

2. Description of the Related Art

As is known, multilevel nonvolatile memory cells are normally read through analog sense amplifiers which supply at output analog voltages that are substantially proportional to the threshold voltages of respective cells selected for reading. These output voltages are then converted into corresponding digital signals through analog-to-digital converters.

In order to reduce errors in the reading phase, the sense amplifiers and the analog-to-digital converters are normally supplied with boosted supply voltages, higher than the external supply voltage generated by special voltage boosting circuits (for example charge pumps). In this way, in fact, one can avoid compressing the dynamic of the signals detected (cell voltages) with voltage translators to adapt it to the input dynamic of converters supplied with the external supply voltage; consequently, the voltage levels corresponding to the data stored in the memory cells are well separated from each other and the probability of error is low.

In particular, the analog-to-digital converters comprise at least one comparator, for example of the type described in "Design Techniques for High Speed, High Resolution Comparators," by B. Razavi, B. Wooley, IEEE Journal Solid State Circuits, Vol. 27, No. 2, 1992.

This comparator is illustrated in FIG. 1 and is indicated with the reference number 1. The comparator I has a pair of input terminals 1a, 1b connected to outputs of a sense amplifier not shown and a first and a second output terminal 1c, 1d and comprises an amplification stage 2 and a latch stage 3. The amplification stage 2 is formed by a fully differential transconductance operational amplifier and has an inverting input and a non inverting input connected, on one side, to the input terminals 1a and 1b, respectively, of the comparator 1 through respective input switches 5 controlled in phase with each other, and, on the other side, to ground through respective first equalization switches 6 controlled in phase with each other and in phase opposition with respect to the input switches 5.

The latch stage 3 comprises a latch amplifier 8 and a pair of feedback branches 10.

The latch amplifier 8, which is fully differential, has an inverting input 8a and a non inverting input 8b, and an inverting output and a non inverting output, connected respectively to the non inverting output and to the inverting output of the amplification stage 2.

The feedback branches 10 each comprise a non inverting driving stage 11 and a sampling capacitor 12, connected to each other in series, and are respectively placed between the inverting output and the inverting input 8a and between the non inverting output and the non inverting input 8b of the latch amplifier 8, to define positive feedback loops. Output terminals of the driving stages 11 define the first and the second output terminal 1c, 1d of the comparator 1.

The latch stage 3 further comprises a pair of second equalization switches 14, connected between a respective input 8a, 8b of the latch amplifier 8 and ground; a pair of latch switches 13, each connected between a respective input 8a, 8b of the latch amplifier 8 and a respective sampling capacitor 12; a pair of sampling switches 15, each connected between a respective sampling capacitor 12 and ground. The second equalization switches 14 are controlled in phase with each other and in phase opposition with respect to the latch switches 13; the sampling switches 15 are opened simultaneously and closed in advance with respect to the second equalization switches 14.

The comparator 1 further comprises a single supply line 18 to which are connected respective supply terminals of the amplification stage 2, of the latch amplifier 8 and of the driving stages 11.

Since the amplification stage 2 must have a wider input dynamic than that allowed by the supply voltages normally available in nonvolatile memories, on the supply line 18 there must necessarily be a boosted voltage $V_p$, higher than the supply voltage.

So, in the known comparators, also the latch amplifier 8 and the driving stages 11 receive the same boosted voltage $V_p$ supplied to the amplifying stage 2 and all the currents absorbed by the comparator 1 during operation must be supplied through the supply line 18.

This is a considerable drawback since, as already mentioned, the boosted voltage $V_p$ must be generated by special charge pump circuits (not shown here) which can supply currents with a not excessively high value, as is known. Consequently, several charge pumps must be realized, working in parallel, so that the respective currents can be combined in order to provide the total current required by the comparators 1 present in the analog-to-digital converters of the nonvolatile memory. However, the realization of the charge pumps involves the occupation of a considerably large area, which is a particular disadvantage. Moreover, the use of the boosted voltage $V_p$ for all the components of the comparator 1 determines a high power absorption.

BRIEF SUMMARY OF THE INVENTION

An embodiment of the present invention realizes a multilevel nonvolatile memory that is free from the drawbacks described.

The multilevel nonvolatile memory includes a supply line at a supply voltage; a boosting circuit having an input connected to the supply line and an output supplying a boosted voltage higher than the supply voltage; a boosted line connected to the output of the boosting circuit; and a reading circuit. The reading circuit includes a comparator having a first and a second input, a first and a second output, an amplification stage, and a latch stage. The amplification stage has a supply terminal connected to said boosted line and the latch stage presents a supply terminal connected to the supply line.

BRIEF DESCRIPTION OF THE SEVERAL VIEWS OF THE DRAWINGS

For a better understanding of the invention, an embodiment is now described, purely as a non-limiting example, with reference to the enclosed drawings, in which.

DETAILED DESCRIPTION OF THE INVENTION

Figure 2:
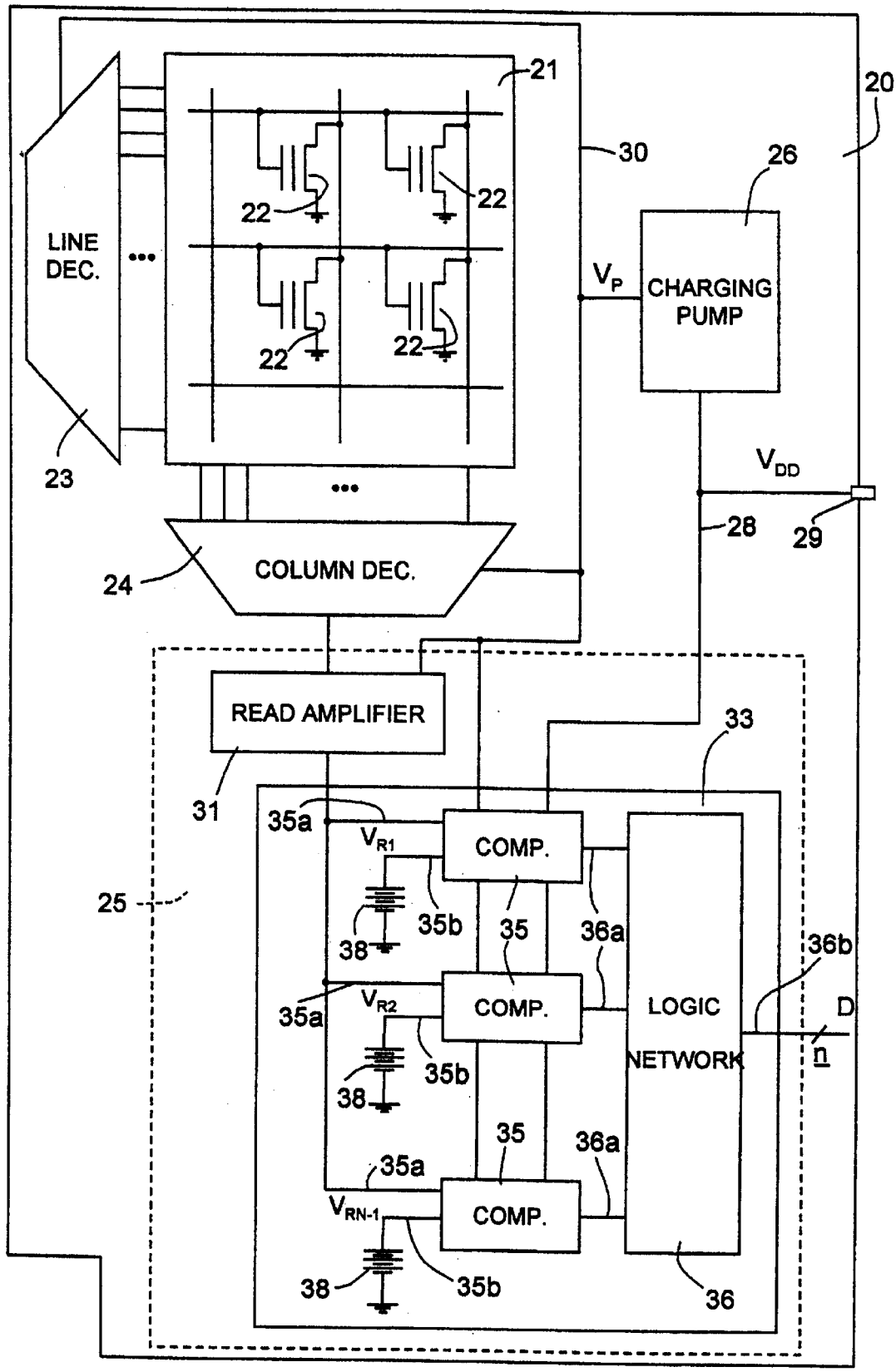
FIG. 2 is a block diagram of a multilevel nonvolatile memory according to the present invention.

With reference to FIG. 2, a multilevel nonvolatile memory 20 according to the present invention, for example an eight level flash memory, comprises a memory array 21 formed by a plurality of memory cells 22 arranged in lines and columns; line decoders 23 and column decoders 24, both of a known type; a reading circuit 25; a voltage-boosting circuit, for example a charging pump 26.

The memory 20 further comprises a supply line 28, connected to a supply pin 29 of the memory 20 and receiving, in a known manner, a supply voltage $V_{DD}$, for example of 3 V.

The charge pump 26 has an input connected to the supply line 28, from which it receives the supply voltage $V_{DD}$, and an output connected to a boosted line 30, on which it supplies a boosted voltage $V_P$, for example of 10 V, and to which are connected the line decoders 23 and column decoders 24 and the read circuit 25.

The read circuit 25 comprises at least one reading amplifier 31 and an analog-to-digital converter 33.

The reading amplifier 31, of analog type, has an input selectively connectable, through the column decoder 24 and in a known way, to a memory cell 22 to be read, and an output connected to the analog-to-digital converter 33 and supplying a cell voltage $V_C$ substantially proportional to the threshold voltage of the memory cell 22 to be read.

The analog-to-digital converter 33, preferably of the flash type, comprises N-1 comparators 35, where N is the number of levels of the memory 20 (eight, in the embodiment illustrated). The comparators 35 have respective first inputs 35a connected to the output of the reading amplifier 31, so as to receive the cell voltage $V_C$; respective second inputs 35b connected to respective reference voltage generators 38, each supplying a reference voltage $V_{R1}, V_{R2}, \ldots, V_{RN-1}$ representing a respective logic value; and respective outputs connected to respective inputs 36a of a logic network 36, of a known type, not shown in detail.

Moreover, the logic network 36 has n output terminals 36b, with n=$\log_2$ N, supplying a n-bit logic signal D representing data stored in the memory cell 22 to be read.

According to the invention, each of the comparators 35 is also connected both to the supply line 28 and to the boosted line 30, so as to receive the supply voltage $V_{DD}$ and the boosted voltage $V_P$.

Figure 3:
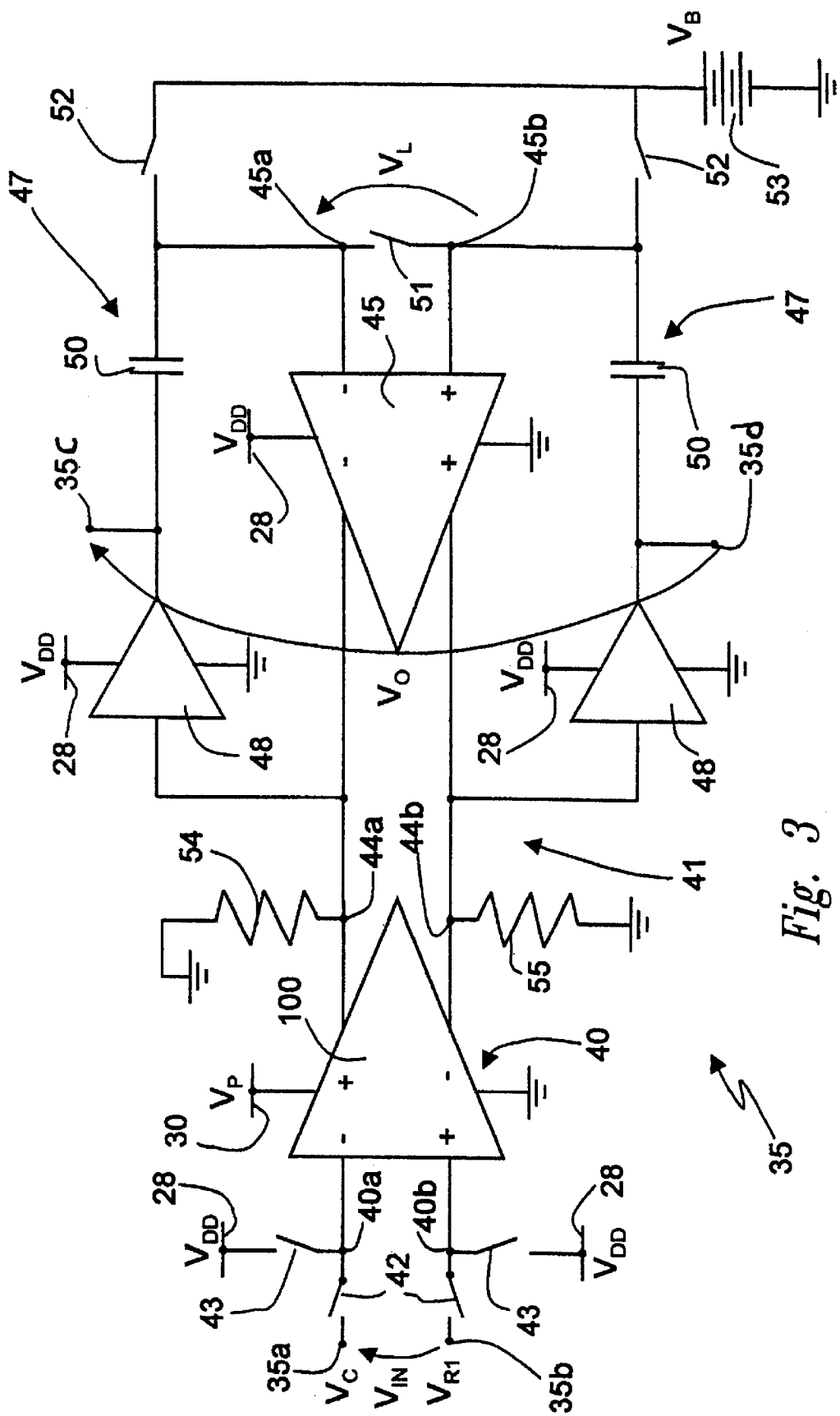
FIG. 3 is a simplified circuit diagram of a block of FIG. 2.

With reference to FIG. 3, one of the comparators 35 is shown in greater detail, in particular the one receiving the reference voltage $V_{R1}$ at its second input 35b.

The comparator 35 comprises an amplification stage 40 and a latch stage 41. The amplification stage 40 comprises an fully differential transconductance operational amplifier 100, and has a first and a second input 40a, 40b which may be alternatively connected to the first and, respectively, to the second input 35a, 35b of the comparator 35, through respective input switches 42, and to the supply line 28, through respective first equalization switches 43. A first and a second output of the amplification stage 40 are connected respectively to a first and a second node 44a, 44b. Moreover, the amplification stage 40 presents a first supply terminal, connected to the boosted line 30, so as to receive the boosted voltage $V_P$, and a second supply terminal, connected to ground.

The latch stage 41 comprises a fully differential latch amplifier 45, and a pair of feedback branches 47.

The latch amplifier 45 has a first and a second input 45a, 45b, between which is present a latch voltage $V_L$; and a first and a second output of the latch amplifier 45 are connected to the first and, respectively, to the second node 44a, 44b.

Moreover, the latch amplifier 45 comprises a first supply terminal, connected to the supply line 28, to receive the supply voltage $V_{DD}$, and a second supply terminal, connected to ground.

The feedback branches 47 are connected between the first node 44a and the first input 45a of the latch amplifier 45 and, respectively, between the second node 44b and the second input 45b of the latch amplifier 45; in this way, the feedback branches form, with the latch amplifier 45, respective positive feedback loops. Moreover, each feedback branch 47 comprises a non inverting driving stage 48 and a sampling capacitor 50, arranged in series with each other. In particular, the driving stages 48 have inputs connected to the first and, respectively, to the second node 44a, 44b, and outputs defining a first and, respectively, a second output 35c, 35d of the comparator 35, between which there is an output voltage $V_O$; the sampling capacitors 50 have first terminals connected to respective outputs of the driving stages 48 and second terminals connected to the first and, respectively to the second input 45a, 45b of the latch amplifier 45.

The driving stages 48 comprise respective first supply terminals, connected to the supply line 28, to receive the supply voltage $V_{DD}$, and respective second supply terminals connected to ground.

The latch stage 41 further comprises a second equalization switch 51, connected between the inputs 45a, 45b of the latch amplifier 45; and a pair of sampling switches 52, having first terminals connected to the first and, respectively, to the second input 45a, 45b of the latch amplifier 45 and second terminals connected to an equalization voltage generator 53, supplying an equalization voltage $V_B$.

Lastly, the comparator 35 comprises a pair of load resistive elements 54, 55, connected between the first node 44a and ground and, respectively, between the second node 44b and ground.

Operation of the comparator 35 is the following.

In a first step, or sampling step, the input switches 42, the second equalization switch 51 and the sampling switches 52 are closed, while the first equalization switches 43 are open. In this way, between the first and the second input of the amplification stage 40 there is the input voltage $V_{IN}$, and the inputs 45a, 45b of the latch amplifier 45 are connected to the equalization voltage generator 53 and, moreover, directly to each other. In this step, the sampling capacitors 50 are charged at respective sampled voltages $V_{M1}, V_{M2}$, the values of which partly depend on the action of the amplification stage 40, which amplifies the input voltage $V_{IN}$ for a predetermined gain value, and partly on the offset voltages of the amplification stage 40 itself, of the latch amplifier 45 and of the driving stages 48.

In a second step, or latching step, the input switches 42, the second equalization switch 51 and the sampling switches 52 are opened, while the first equalization switches 43 are closed. The inputs 40a, 40b of the amplification stage 40 are therefore connected to the supply line 28, so that they are equalized at the same constant voltage (equal to the supply voltage $V_{DD}$), while the inputs 45a, 45b of the latch amplifier 45 are disconnected from the equalization voltage generator 53. The sampling capacitors 50 are therefore placed at high impedance and, for the whole duration of the latching step, they are maintained charged at the respective sampling voltages $V_{M1}, V_{M2}$ reached in the sampling step, practically acting as memory elements.

When the latching step begins, between the inputs 45a, 45b of the latch amplifier 45 there is a voltage equal to the input voltage $V_{IN}$, multiplied by the gain of the amplification stage 40. In fact, the first terminals of the sampling capacitors 50, connected to the outputs of the respective driving stages 48, are at a voltage value determined only by the contribution of the offset voltages of the amplification stage 40, of the latch amplifier 45 and of the driving stages 48. This contribution compensates the corresponding contribution of the offset voltages present in the sampled voltages $V_{M1}$, $V_{M2}$ stored by the sampling capacitors 50. Consequently, the latch voltage $V_L$, present between the second terminals of the sampling capacitors 50 (connected to the first and, respectively, to the second input 45a, 45b of the latch amplifier 45), is determined solely by the input voltage $V_{IN}$, multiplied by the gain of the amplification stage 40.

Subsequently, owing to the positive feedback loops formed by the latch amplifier 45 and by the feedback branches 47, the latch voltage $V_L$ and the output voltage $V_O$ are amplified (latched), in a known way.

At the end of the latching step, the latch voltage $V_L$ and the output voltage $V_O$ have the same sign as the input voltage $V_{IN}$; in particular, the output voltage $V_O$ is positive, when the cell voltage $V_C$ is higher than the reference voltage $V_{R1}, V_{R2}, \ldots, V_{RN-1}$ supplied to the second input 35b of the comparator 35 ($V_{R1}$, in the case shown in FIG. 3), and negative, in the opposite case.

Practically, in the sampling step the input voltage is detected, amplified and stored by the sampling capacitors, together with a contribution due to the offset voltages; at the same time, the inputs 45a, 45b of the latch amplifier 45 are equalized. In the latching step, on the other hand, the contribution of the offset voltages is compensated and the remaining contribution, due to the input voltage $V_{IN}$, is latched. Moreover, the inputs 40a, 40b of the amplification stage 40 are equalized.

Figure 4:
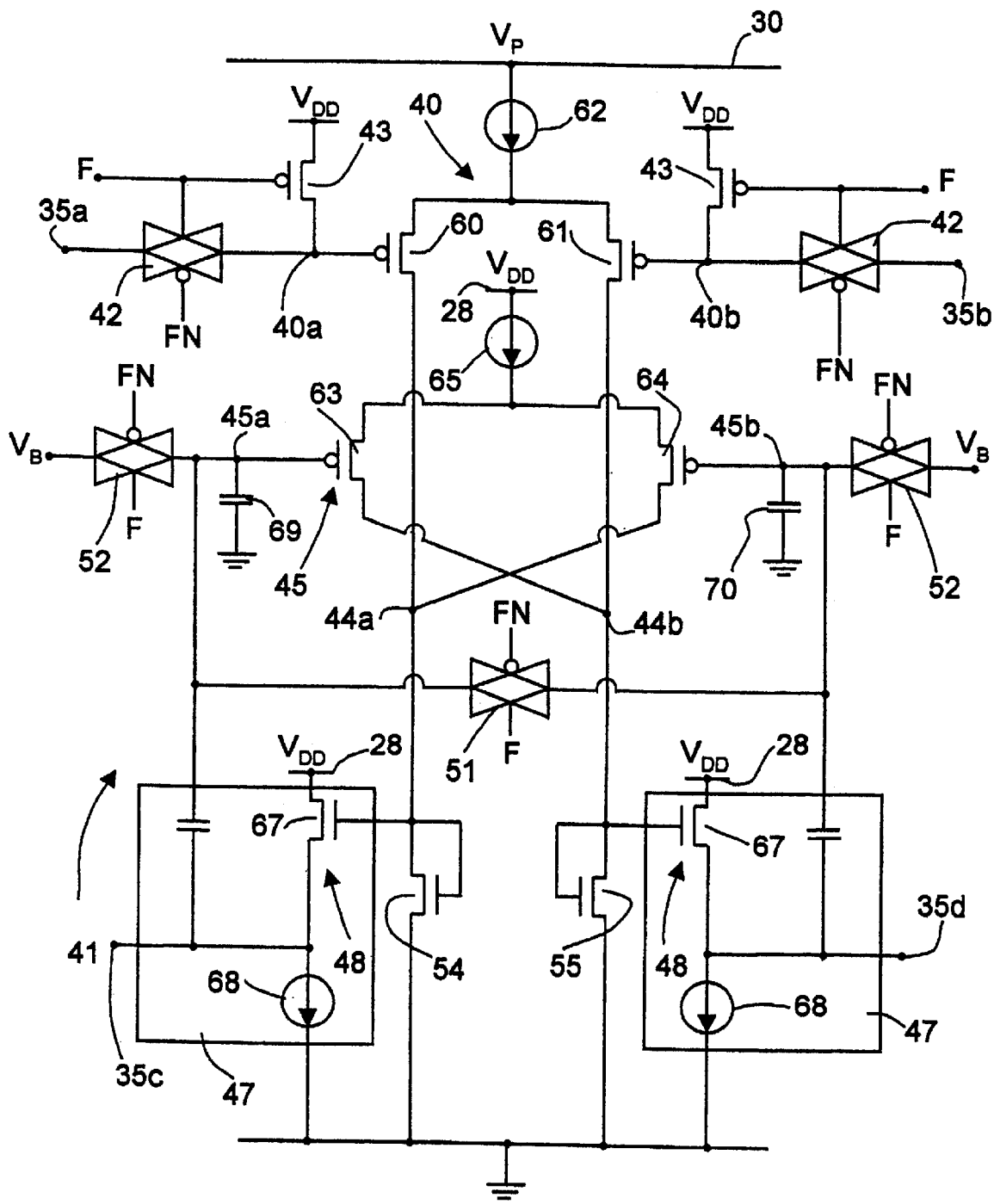
FIG. 4 is a more detailed circuit diagram of the block of FIG. 3.

FIG. 4 shows a more detailed circuit diagram of the comparator 35.

As shown in the figure, the amplification stage 40 comprises a first and a second amplification transistor 60, 61, of PMOS type, having source terminals connected to each other, drain terminals connected to the first and, respectively to the second node 44a, 44b and gate terminals respectively forming the inputs 40a, 40b of the amplification stage 40. A first bias current generator 62 is connected between the boosted line 30 and the source terminals of the amplification transistors 60, 61. Consequently, the amplification stage 40 is supplied with the boosted voltage $V_P$.

The load resistive elements 54, 55 are formed preferably by respective NMOS type transistors, having source terminals connected to ground and drain and gate terminals directly connected to the first and, respectively, to the second node 44a, 44b.

The latch amplifier 45 comprises a first and a second latch transistor 63, 64, having gate terminals forming the first and, respectively, the second input 45a, 45b, source terminals connected with each other and drain terminals connected to the second and, respectively to the first node 44b, 44a. A second bias current generator 65 is connected between the standard supply line 28 and the source terminals of the latch transistors 63, 64. Consequently, the latch stage 45 is supplied with the supply voltage $V_{DD}$.

The feedback branches 47 are connected between the first node 44a and the first input 45a of the latch amplifier 45 and, respectively, between the second node 44b and the second input 45b of the latch amplifier 45; in this way, the feedback branches 47 form, with the latch amplifier 45, respective positive feedback loops, as already mentioned.

The driving stages 48 comprise respective driving transistors 67, of NMOS type, and respective third bias current generators 68. In detail, the driving transistors 67 have drain terminals connected to the supply line 28, source terminals connected to respective third current generators 68 and gate terminals connected respectively to the first and to the second node 44a, 44b. Also the driving stages 48 are therefore supplied with the supply voltage $V_{DD}$.

Preferably, the comparator 35 comprises a pair of filter capacitors 69, 70, having first terminals connected to the first and, respectively, to the second input 45a, 45b of the latch amplifier 45 and second terminals connected to ground.

The input switches 42, the second equalization switch 51 and the sampling switches 52 are formed by respective CMOS "transfer gate" switches, receiving a timing signal F in direct form, at respective first control terminals, and in negated form (indicated in FIG. 4 with the symbol FN), at respective second control terminals.

The first equalization switches 43 are instead preferably formed by respective PMOS type transistors having source terminals connected to the supply line 28, gate terminals connected to the first and, respectively, to the second input 40a, 40b of the amplification stage 40, and receiving the timing signal F at its gate terminals.

The timing signal F has a first logic level, in the presence of which the input switches 42, the second equalization switch 51 and the sampling switches 52 are closed, while the first sampling switches 43 are opened; and a second logic level, in the presence of which the input switches 42, the second equalization switch 51 and the sampling switches 52 are opened, while the first sampling switches 43 are closed.

The advantages offered by the invention are clear from the above explanation.

In particular, the use of two distinct supply lines in the comparator 35 allows the boosted voltage $V_P$ to be supplied only to the amplification stage 40, which must have a wide input dynamic, while the latch amplifier 45 and the driving stages 48 advantageously receive the supply voltage $V_{DD}$. In this way, the current which must be supplied by the charge pumps is considerably reduced with respect to that required by traditional comparators of the type shown in FIG. 1. A smaller number of charge pumps must therefore be realized and a considerable saving of the occupied area is obtained, as well as a decrease of consumption.

Another advantage is offered by the fact that, with respect to prior art comparators, the comparator 35 comprises, in the latch stage 40, a smaller number of switches. This allows, on one hand, a further reduction of area to be achieved and, on the other, a decrease of the noise due to the so-called "clock feed through" phenomenon, which occurs when the switches are turned off. As those skilled in the art know, this phenomenon is caused by the fact that the charges that form the channel of a MOS transistor are removed when the transistor is cut off. The effect of the phenomenon is of course greater, the higher the number of transistors that are switched off at the same time.

The comparator 35 is also fast and allows extremely short conversion times to be obtained. In fact, since the compensation of the contributions due to the offset can be carried out at the same time as the equalization of the amplification stage, only two operative steps are necessary to complete sampling of the input voltage $V_{IN}$.

Lastly it is clear that modifications and variations may be made to the device described, without departing from the scope of the present invention.

Figure 1:
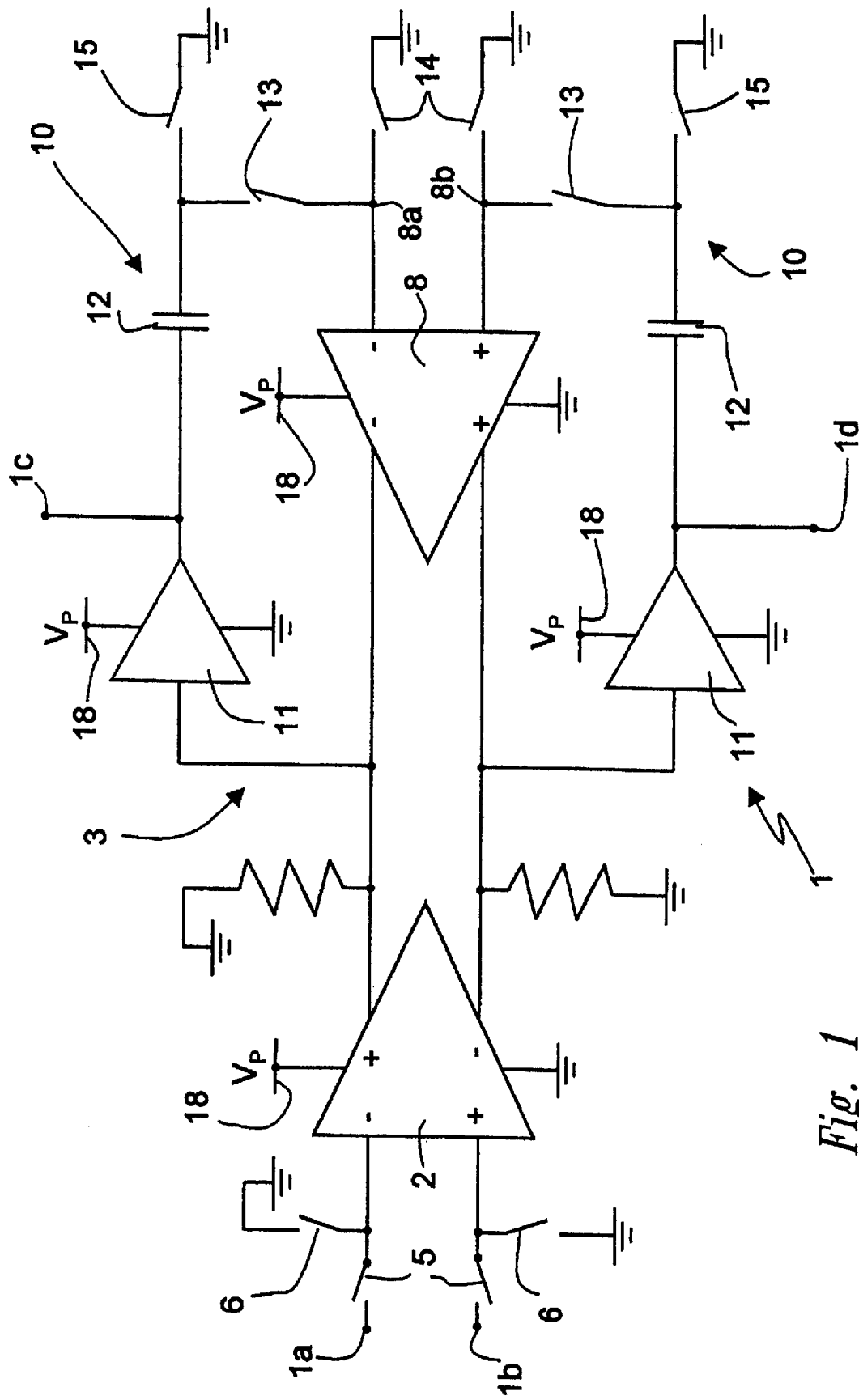
FIG. 1 shows a block diagram of a known comparator.

In particular, the latch stage may comprise latch switches, sampling switches and second equalization switches as described with reference to FIG. 1. In this case, the sampling switches and the second equalization switches are controlled in phase with the input switches and the latch switches are controlled in phase with the first equalization switches.

We claim:

1. A multilevel nonvolatile memory comprising:

a supply line at a supply voltage;

boosting means, having an input connected to said supply line and an output supplying a boosted voltage higher than said supply voltage;

a boosted line, connected to said output of said boosting means; and a reading circuit including comparator means having a first and a second input, a first and a second output, an amplification stage, and a latch stage; wherein said amplification stage has a supply terminal connected to said boosted line and said latch stage presents a supply terminal connected to said supply line.

2. The memory according to claim 1, wherein said amplification stage comprises fully differential amplifier means, having a supply terminal connected to said boosted line.

3. The memory according to claim 2, wherein said amplification stage comprises a first and a second input alternatively connected respectively to said first and second inputs of said comparator means, through input switch means, and to a constant voltage line, through equalization switch means.

4. The memory according to claim 3, wherein said constant voltage line is said supply line.

5. The memory according claim 1, wherein said latch stage comprises fully differential latch amplifying means, said latch amplifying means having a supply terminal connected to said supply line and a first and a second input, connected respectively to said first and second outputs of said comparator means.

6. The memory according to claim 5, wherein said latch stage comprises positive feedback means including driving means, having respective supply terminals connected to said supply line, and sampling means.

7. The memory according to claim 5, wherein said latch stage comprises:

equalization switch means connected between said first and second inputs of said latch amplifying means; and sampling switch means, having first terminals connected to said first and, respectively, to said second input of said latch amplifying means and second terminals connected to equalization voltage generating means.

8. The memory according to claim 7, wherein said latch stage comprises filtering means, having first terminals connected to said first and, respectively, to said second input of said latch amplifying means and second terminals connected to a reference voltage line.

9. A comparator with offset compensation, comprising:

an amplification stage including fully differential amplifying means;

a latch stage; comprising fully differential latch amplifying means, and positive feedback means including driving means and sampling means;

a supply line at a supply voltage $V_{DD}$; and a boosted line at a boosted voltage, higher than said supply voltage; said amplification stage having a supply terminal connected to said boosted line; and said latch amplifying means and said driving means having respective supply terminals connected to said supply line.

10. In a multilevel nonvolatile memory having a supply line supplying a supply voltage; voltage boosting means having an input connected to said supply line and an output supplying a boosted voltage, higher than said supply voltage; a boosted line, connected to said output of said voltage boosting means; and a reading circuit including comparator means having a first and a second input a first and a second output between which there is an output voltage, an amplification stage, and a latch stage; said amplification stage having a first and a second input and a supply terminal connected to said boosted line; and said latch stage having a first and a second input, connected respectively to said first and second outputs of said comparator means, and a supply terminal connected to said supply line; and said latch stage including memory means, a method for comparing a first electric quantity and a second electric quantity, comprising the step of:

supplying said first and second electric quantities respectively to said first and second inputs of said comparator means;

equalizing said first and second inputs of said amplification stage;

equalizing said first and second inputs of said latch stage;

storing third electric quantities, correlated to said first and second electric quantity;

latching said output voltage; wherein said step of equalizing said latch stage is carried out simultaneously with said step of storing third electric quantities and said step of equalizing said amplification stage is carried out simultaneously with said step of latching said output voltage.

11. A method according to claim 10, further comprising the step of providing equalization voltage generating means, supplying an equalizing voltage, and wherein said step of storing third electric quantities comprises the steps of:

connecting said first and second inputs of said amplification stage respectively to said first and second inputs of said comparator means;

disconnecting said first and second inputs of said amplification stage from said supply line; and connecting said first and second inputs of said latch stage to said equalization voltage generating means.

12. A method according to claim 10, wherein said step of equalizing said latch stage comprises the steps of:

connecting said first and second inputs of said latch stage to said equalization voltage generating means; and directly connecting to each other said first and second inputs of said latch stage.

13. A method according to claim 10, wherein said step of equalizing said amplification stage comprises the steps of:

connecting said first and second inputs of said amplification stage to said supply line; and disconnecting said first and second inputs of said amplification stage from said first and second inputs of said comparator means respectively.

14. A method according to claim 10, wherein said step of latching said output voltage comprises the steps of:

disconnecting said first and second inputs of said latch stage from said equalization voltage generating means; and disconnecting said first input of said latch stage from said second input of said latch stage.

15. A comparator comprising:

first, second, and third supply voltages;

differential first and second inputs;

differential first and second outputs;

an equalization voltage generator supplying an equalization voltage and having an output and an input wherein the input is coupled to the third supply voltage;

an amplification circuit having differential first and second inputs respectively coupled to the differential first and second inputs of the comparator and first and second supply inputs respectively coupled to the first and third supply voltages;

a latch amplifier circuit having first and second differential inputs coupled to the equalization voltage, first and second supply inputs respectively coupled to the second and third supply voltages and the equalization voltage, and first and second differential outputs coupled to the first and second differential outputs of the amplification circuit;

a first feedback circuit coupled between the first differential input and first differential output of the latch amplifier circuit; and a second feedback circuit coupled between the second differential input and second differential output of the latch amplifier circuit.

16. The comparator according to claim 15 wherein the first supply voltage is greater than the second and third supply voltages; and the second supply voltage is greater than the third supply voltage.

17. The comparator according to claim 15 wherein the amplification circuit further comprises:

first and second MOS transistors coupled between the first supply voltage and the first and second differential outputs of the amplification circuit; and having respective control inputs;

a first plurality of equalization switches connecting the control input of the first MOS transistor alternatively between the second supply voltage and the first differential input of the amplification circuit; and a second plurality of equalization switches connecting the control input of the second MOS transistor alternatively between the second supply voltage and the second differential input of the amplification circuit.

18. The comparator according to claim 15 wherein the latch amplifier circuit further comprises:

first and second MOS transistors respectively coupled between the second supply voltage and the first and second differential outputs of the latch amplifier circuit, and having respective control terminals; and first and second equalization switches respectively connected between the output of the equalization voltage generator and the control terminals of the first and second MOS transistors.

19. The comparator according to claim 15 wherein the first feedback circuit further comprises:

a drive transistor coupled between the first differential output of the latch amplifier circuit and the first differential output of the comparator; and a charge storage device coupled between the first differential input of the latch amplifier circuit and the differential first output of the comparator.

20. The comparator according to claim 15, further comprising a resistive load device coupled between the first differential output of the amplification circuit and the third supply voltage.

* * * * *